United States Patent
Inoue et al.

(10) Patent No.: US 10,820,413 B2
(45) Date of Patent: *Oct. 27, 2020

(54) METAL-CLAD LAMINATE, METAL MEMBER WITH RESIN, AND WIRING BOARD

(71) Applicant: Panasonic Intellectual Property Management Co., Ltd., Osaka (JP)

(72) Inventors: Yuki Inoue, Fukushima (JP); Tatsuya Arisawa, Fukushima (JP); Yuki Kitai, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 210 days.

This patent is subject to a terminal disclaimer.

(21) Appl. No.: 16/069,687

(22) PCT Filed: Jan. 16, 2017

(86) PCT No.: PCT/JP2017/001157
§ 371 (c)(1),
(2) Date: Jul. 12, 2018

(87) PCT Pub. No.: WO2017/130760
PCT Pub. Date: Aug. 3, 2017

(65) Prior Publication Data
US 2019/0014661 A1    Jan. 10, 2019

(30) Foreign Application Priority Data

Jan. 26, 2016  (JP) .................. 2016-012404

(51) Int. Cl.
*C08L 63/00* (2006.01)
*C08L 71/12* (2006.01)
(Continued)

(52) U.S. Cl.
CPC ............ *H05K 1/0373* (2013.01); *B32B 15/08* (2013.01); *B32B 27/18* (2013.01); *C08G 59/226* (2013.01);
(Continued)

(58) Field of Classification Search
CPC ........ B32B 15/08; B32B 15/092; C08L 63/00; C08L 71/12; C08K 5/0066
See application file for complete search history.

(56) References Cited

U.S. PATENT DOCUMENTS 7,255,925 B2 * 8/2007 Chung .................... B32B 15/08
                                                              428/416
8,748,541 B2 * 6/2014 Mori ......................... C08J 5/24
                                                              525/396
(Continued)

FOREIGN PATENT DOCUMENTS

JP    2004-025835    1/2004

OTHER PUBLICATIONS

International Search Report of PCT application No. PCT/JP2017/001157 dated Mar. 28, 2017.

*Primary Examiner* — Rip A Lee
(74) *Attorney, Agent, or Firm* — Greenblum & Bernstein, P.L.C.

(57) ABSTRACT

The metal-clad laminate includes an insulating layer and a metal layer that exists in contact with at least one surface of this insulating layer. The insulating layer includes a cured product of a thermosetting resin composition that contains an epoxy compound having a number-average molecular weight of 1000 or less and at least two epoxy groups per molecule, a polyphenylene ether, a cyanate ester compound, a curing catalyst, and a halogen-based flame retardant. The halogen-based flame retardant is a flame retardant incompatible and dispersed in the thermosetting resin composition. The metal layer includes a metal substrate and a cobalt-
(Continued)

containing barrier layer provided on at least a contact surface side of this metal substrate with the insulating layer. In the metal-clad laminate, the contact surface has, as surface roughness, a ten-point average roughness Rz of 2 μm or less.

8 Claims, 2 Drawing Sheets

(51) Int. Cl.

| | | |
|---|---|---|
| B32B 15/08 | (2006.01) | |
| H05K 1/03 | (2006.01) | |
| B32B 27/18 | (2006.01) | |
| C09D 163/00 | (2006.01) | |
| H05K 3/38 | (2006.01) | |
| C08G 59/68 | (2006.01) | |
| H05K 1/09 | (2006.01) | |
| C08G 59/22 | (2006.01) | |
| C08G 59/24 | (2006.01) | |
| C08G 59/40 | (2006.01) | |
| C08J 5/24 | (2006.01) | |
| H05K 1/02 | (2006.01) | |
| H05K 3/02 | (2006.01) | |
| H05K 3/00 | (2006.01) | |

(52) U.S. Cl.
CPC ......... *C08G 59/24* (2013.01); *C08G 59/4007* (2013.01); *C08G 59/685* (2013.01); *C08J 5/24* (2013.01); *C09D 163/00* (2013.01); *H05K 1/024* (2013.01); *H05K 1/0353* (2013.01); *H05K 1/09* (2013.01); *H05K 3/022* (2013.01); *H05K 3/384* (2013.01); *C08J 2363/00* (2013.01); *C08J 2363/10* (2013.01); *C08J 2471/12* (2013.01); *H05K 3/0014* (2013.01); *H05K 2201/012* (2013.01); *H05K 2201/0338* (2013.01); *H05K 2201/0355* (2013.01); *H05K 2203/068* (2013.01)

(56) References Cited

U.S. PATENT DOCUMENTS

| | | | | |
|---|---|---|---|---|
| 9,120,293 | B2* | 9/2015 | Yokota | B32B 27/38 |
| 9,567,481 | B2* | 2/2017 | Saito | C08G 59/18 |
| 2005/0121229 | A1* | 6/2005 | Takai | B32B 15/08 |
| | | | | 174/261 |
| 2006/0167189 | A1* | 7/2006 | Mizuno | B32B 15/08 |
| | | | | 525/396 |
| 2010/0218982 | A1* | 9/2010 | Fujiwara | C08G 59/4014 |
| | | | | 174/257 |
| 2013/0337229 | A1* | 12/2013 | Kobayashi | B32B 27/08 |
| | | | | 428/149 |
| 2018/0050515 | A1* | 2/2018 | Luo | C08L 47/00 |
| 2019/0014661 | A1* | 1/2019 | Inoue | H05K 3/022 |
| 2019/0270280 | A1* | 9/2019 | Arisawa | B32B 15/08 |

* cited by examiner

METAL-CLAD LAMINATE, METAL MEMBER WITH RESIN, AND WIRING BOARD

This application is a U.S. national stage application of the PCT International Application No. PCT/JP2017/001157 filed on Jan. 16, 2017, which claims the benefit of foreign priority of Japanese patent application 2016-012404 filed on Jan. 26, 2016, the contents all of which are incorporated herein by reference.

Field of the Invention

The present disclosure relates to a metal-clad laminate, a metal member with resin, and a wiring board.

Description of the Related Art

Along with an increase in amount of information to be processed, rapidly developing in various electronic devices are mounting techniques involving, for example, high integration of a semiconductor device to be incorporated, high density of wiring, and making multilayer. Also required is, for example, a wiring board compatible with high-frequency waves, such as a millimeter-wave radar substrate for in-vehicle use.

When a signal is transmitted to wiring provided in a wiring board, for example, a transmission loss occurs due to a conductor that forms the wiring and due to a dielectric body around the wiring. This transmission loss has been known to particularly occur when a high-frequency signal is transmitted to wiring provided in a wiring board. Because of this phenomenon, the wiring board is required to reduce the loss during signal transmission in order to increase transmission speed of a signal. The wiring board compatible with high-frequency waves is particularly required to have this capability. In order to satisfy this requirement, a material having a low dielectric constant and a low dielectric dissipation factor is considered to be used as a substrate material for producing an insulating layer that constitutes a wiring board.

A metal-clad laminate and a metal member with resin that are used to produce, for example, a wiring board include not only the insulating layer but also a metal layer on the insulating layer. The wiring board also includes not only the insulating layer but also wiring on the insulating layer, such as wiring derived from the metal layer. For example, PTL 1 discloses a metal-clad laminate and a metal member with resin that are produced focusing on such a metal layer.

PTL 1 discloses a metal-clad laminate and a metal foil with resin that include an insulating resin composition layer and a metal foil fixed to one surface or both surfaces of the insulating resin composition layer, the metal foil being surface-treated at least on a side of the insulating resin composition layer and being not substantially roughened on both surfaces.

CITATION LIST

Patent Literature

PTL 1: Unexamined Japanese Patent Publication No. 2004-25835

SUMMARY OF THE INVENTION

PTL 1 describes that it is possible to achieve both adhesiveness and flatness of an interface between the insulating resin composition layer and the metal foil and to also satisfy a practical element involving production of a printed wiring board.

On the other hand, the wiring board is further required to reduce the loss during signal transmission in order to further increase transmission speed of a signal. In order to satisfy this further requirement, various studies have been conducted for the metal-clad laminate, the metal member with resin, and the wiring board.

The present disclosure has been made in view of the foregoing circumstances, and an object of the present disclosure is to provide a metal-clad laminate and a metal member with resin that are capable of suitably producing a wiring board having a reduced loss during signal transmission. Another object of the present disclosure is to provide a wiring board having a reduced loss during signal transmission.

Solution to Problem

A metal-clad laminate according to one aspect of the present disclosure includes an insulating layer and a metal layer that exists in contact with at least one surface of the insulating layer. The insulating layer includes a cured product of a thermosetting resin composition that contains an epoxy compound having a number-average molecular weight of 1000 or less and at least two epoxy groups per molecule, a polyphenylene ether, a cyanate ester compound, a curing catalyst, and a halogen-based flame retardant. The halogen-based flame retardant is a flame retardant incompatible and dispersed in the thermosetting resin composition. The metal layer includes a metal substrate and a cobalt-containing barrier layer provided on at least a contact surface side of the metal substrate with the insulating layer. The contact surface has, as surface roughness, a ten-point average roughness Rz of 2 µm or less.

This configuration can provide a metal-clad laminate capable of suitably producing a wiring board having a reduced loss during signal transmission.

According to the present disclosure, it is possible to provide a metal-clad laminate and a metal member with resin that are capable of suitably producing a wiring board having a reduced loss during signal transmission. According to the present disclosure, it is also possible to provide a wiring board having a reduced loss during signal transmission.

DETAILED DESCRIPTION OF THE PREFERRED EMBODIMENTS

Figure 1:
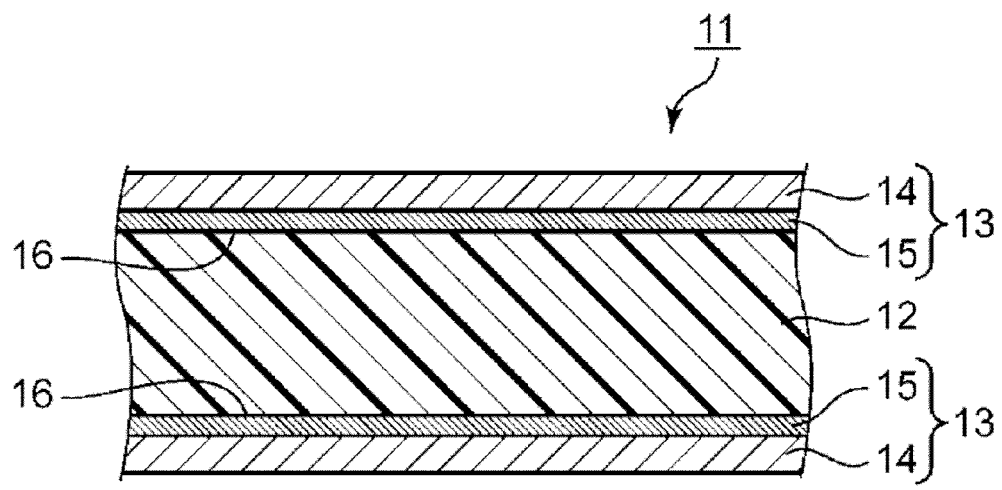
FIG. 1 is a cross-sectional view illustrating a configuration of a metal-clad laminate according to one exemplary embodiment of the present disclosure.

Prior to description of exemplary embodiments of the present disclosure, findings of the inventors and the like of the present disclosure are described below.

(Findings of Inventors and the Like of the Present Disclosure)

The inventors and the like of the present disclosure have focused on wiring formed on an insulating layer in order to reduce a loss in a wiring board during signal transmission.

Specifically, the inventors and the like of the present invention have inferred that high-frequency signals transmitted through wiring is, due to a skin effect, concentrate around a surface of a conductor constituting the wiring. On the other hand, in a metal-clad laminate, a metal member with resin, and a wiring board, roughening is known to be generally performed on a surface (contact surface) of a metal layer or wiring that is in contact with an insulating layer in order to increase adhesion strength of the metal layer or the wiring with the insulating layer. Even under these circumstances, the inventors and the like of the present disclosure have studied reduction of surface roughness of the metal layer or the wiring. The inventors and the like of the present invention have considered that the reduction flattens and smoothen the surface of the metal layer or the wiring to shorten transmission distance of a signal that flows around the surface of the wiring such as wiring derived from the metal layer. That is, the inventors and the like of the present disclosure have found that it is possible to reduce the loss during signal transmission, even without changing a substrate material for producing the insulating layer of the wiring board, by increasing flatness and smoothness of the surface of the wiring that is in contact with the insulating layer, the wiring being formed on the insulating layer of the wiring board.

As the metal layer used in the metal-clad laminate or the metal member with resin, a metal layer that has been plated with nickel having high heat resistance is generally used. The inventors and the like of the present disclosure have studied application of cobalt lower in electrical resistance than nickel, for a barrier layer formed by plating on the surface of the metal layer or the wiring because signals are considered to as described above concentrate around the surface of a conductor constituting the wiring.

Cobalt, however, is lower in heat resistance than nickel. Therefore, the inventors and the like of the present disclosure have studied usage of an insulating layer that includes a cured product obtained by curing a thermosetting resin composition containing a polyphenyl ether excellent in heat resistance. The inventors and the like of the present invention have considered that the usage of such an insulating layer allows a metal-clad laminate obtained to sufficiently retain heat resistance, even when the metal layer is used that includes the barrier layer containing cobalt lower in heat resistance than nickel, because the insulating layer in contact with the metal layer has high heat resistance. The inventors and the like of the present invention have also considered that the insulating layer has excellent dielectric characteristics because the cured product included in the insulating layer contains the polyphenyl ether that has a low dielectric constant and a low dielectric dissipation factor. Accordingly, the inventors and the like of the present invention have considered that the metal-clad laminate including such an insulating layer is capable of further reducing the loss during signal transmission.

Thus, the inventors and the like of the present disclosure have found the present disclosure described later as a result of various studies described above.

A metal-clad laminate according to one aspect of the present disclosure includes an insulating layer and a metal layer that exists in contact with at least one surface of the insulating layer. The insulating layer includes a cured product of a thermosetting resin composition that contains an epoxy compound having a number-average molecular weight of 1000 or less and at least two epoxy groups per molecule, a polyphenylene ether, a cyanate ester compound, a curing catalyst, and a halogen-based flame retardant. The halogen-based flame retardant is a flame retardant incompatible and dispersed in the thermosetting resin composition. The metal layer includes a metal substrate and a cobalt-containing barrier layer provided on at least a contact surface of the metal substrate with the insulating layer. The contact surface has, as surface roughness, a ten-point average roughness Rz of 2 μm or less.

This configuration can provide a metal-clad laminate capable of suitably producing a wiring board having a reduced loss during signal transmission.

Such a metal-clad laminate is considered to be provided for following reasons.

First, the metal layer that is in contact with the insulating layer and is to be wiring of a wiring board has a low surface roughness on the contact surface with the insulating layer as described above, to increase the flatness and smoothness of the contact surface. This is considered to increase the flatness and smoothness of an interface between the insulating layer and the wiring in the wiring board obtained from this metal-clad laminate. This is considered to make it possible for the wiring provided in this wiring board to reduce the loss during signal transmission. Further, the metal layer includes on the contact surface side the barrier layer containing cobalt lower in resistance than nickel. This feature is also considered to be capable of reducing the loss during signal transmission.

Further, the insulating layer includes a cured product of a thermosetting resin composition. This thermosetting resin composition contains a polyphenylene ether that not only has a low dielectric constant and a low dielectric dissipation factor but also is excellent in heat resistance. Therefore, the insulating layer is considered to be high in heat resistance. Further, the thermosetting resin composition contains a halogen-based flame retardant incompatible and dispersed in this composition. A thermosetting resin composition containing a halogen-based flame retardant has sometimes given a cured product having lowered heat resistance. Even when containing a halogen-based flame retardant that can lower the heat resistance, the thermosetting resin composition is considered to give, provided that the halogen-based flame retardant used is the halogen-based flame retardant described above, a cured product excellent in flame retardancy while suppressing a decrease of excellent heat resistance of the polyphenylene ether. Accordingly, the insulating layer is considered to retain excellent dielectric characteristics and heat resistance while exhibiting the flame retardancy by the halogen-based flame retardant.

Cobalt is lower in heat resistance than nickel. Even when the cobalt-containing barrier layer is low in heat resistance, it is considered to be possible to sufficiently retain excellent heat resistance of the insulting layer in the metal-clad laminate obtained, because the insulating layer in contact with this barrier layer is excellent in heat resistance as described above. Due to the reason described above, even including the metal layer that has the cobalt-containing barrier layer low in heat resistance, the metal-clad laminate is considered to be capable of sufficiently secure the heat resistance. Further, the cobalt-containing barrier layer is considered to be excellent also in adhesiveness with the insulating layer. This is considered to make it possible to sufficiently secure the adhesiveness between the metal layer and the insulating layer even when the flatness and smoothness of the contact surface of the metal layer with the insulating layer are increased.

Due to the reasons described above, the metal-clad laminate obtained is a metal-clad laminate capable of suitably producing a wiring board having a reduced loss during signal transmission. Further, this metal-clad laminate is not only capable of suitably producing a wiring board having a reduced loss during signal transmission but also sufficiently exhibits excellent heat resistance, and the flame retardancy by the halogen-based flame retardant.

In the metal-clad laminate, the halogen-based flame retardant preferably has a melting point of 300° C. or higher.

This configuration gives a metal-clad laminate that is more excellent in heat resistance. This is considered to be brought about by a further increase in heat resistance of the insulating layer.

In the metal-clad laminate, the halogen-based flame retardant is preferably at least one selected from the group consisting of ethylene dipentabromobenzene, ethylene bistetrabromoimide, decabromodiphenyloxide, tetradecabromodiphenoxybenzene, and bis(tribromophenoxy)ethane.

This configuration gives a metal-clad laminate that is more excellent in heat resistance. This is considered to be brought about by a further increase in heat resistance of the insulating layer.

In the metal-clad laminate, the polyphenylene ether preferably has a weight-average molecular weight of 5000 or less.

This configuration gives a metal-clad laminate that includes a suitable insulating layer more excellent in, for example, heat resistance with the insulating layer retaining excellent dielectric characteristics of the polyphenylene ether.

In the metal-clad laminate, the epoxy compound is preferably an epoxy compound containing no halogen atom in a molecule (non-halogen-based epoxy compound).

This configuration gives a metal-clad laminate that includes an insulating layer excellent in heat resistance and flame retardancy.

A thermosetting resin composition has sometimes given a cured product having lowered heat resistance when containing an epoxy compound (halogen-based epoxy compound) having a halogen atom in a molecule, such as a brominated epoxy compound, for increasing the flame retardancy. In the metal-clad laminate according to the one aspect of the present disclosure as described above, the insulating layer provided includes a cured product of the thermosetting resin composition containing the halogen-based flame retardant, so that the insulating layer is considered to be capable of exhibiting the flame retardancy while suppressing a decrease in heat resistance. Due to the reason described above, the metal-clad laminate is considered to be obtained that includes the insulating layer excellent in heat resistance and flame retardancy.

Further, in the metal-clad laminate, the epoxy compound is preferably at least one selected from a dicyclopentadiene epoxy compound, a bisphenol F epoxy compound, a bisphenol A epoxy compound, and a biphenyl epoxy compound.

This configuration gives a metal-clad laminate that includes a suitable insulating layer more excellent in, for example, heat resistance with the insulating layer retaining excellent dielectric characteristics of the polyphenylene ether. This is considered to be brought about by high compatibility of the epoxy compound with the polyphenylene ether.

A metal member with resin according to another aspect of the present disclosure includes an insulating layer and a metal layer that exists in contact with one surface of the insulating layer. The insulating layer includes a half-cured product of a thermosetting resin composition that contains an epoxy compound having a number-average molecular weight of 1000 or less and at least two epoxy groups per molecule, a polyphenylene ether, a cyanate ester compound, a curing catalyst, and a halogen-based flame retardant. The halogen-based flame retardant is a flame retardant incompatible and dispersed in the thermosetting resin composition. The metal layer includes a metal substrate and a cobalt-containing barrier layer provided on at least a contact surface of the metal substrate with the insulating layer. The contact surface has, as surface roughness, a ten-point average roughness Rz of 2 µm or less.

This configuration can provide a metal member with resin capable of suitably producing a wiring board having a reduced loss during signal transmission. Further, this metal member with resin is not only capable of suitably producing a wiring board having a reduced loss during signal transmission but also sufficiently exhibits excellent heat resistance, and the flame retardancy by the halogen-based flame retardant.

A wiring board according to another aspect of the present disclosure includes an insulating layer and wiring that exists in contact with at least one surface of the insulating layer. The insulating layer includes a cured product of a thermosetting resin composition that contains an epoxy compound having a number-average molecular weight of 1000 or less and at least two epoxy groups per molecule, a polyphenylene ether, a cyanate ester compound, a curing catalyst, and a halogen-based flame retardant. The halogen-based flame retardant is a flame retardant incompatible and dispersed in the thermosetting resin composition. The wiring includes a metal substrate and a cobalt-containing barrier layer provided on at least a contact surface of the metal substrate with the insulating layer. The contact surface has, as surface roughness, a ten-point average roughness Rz of 2 µm or less.

This configuration can provide a wiring board having a reduced loss during signal transmission. Further, this wiring board not only has a reduce loss during signal transmission but also sufficiently exhibits excellent heat resistance, and the flame retardancy by the halogen-based flame retardant.

EXEMPLARY EMBODIMENTS

Hereinafter, exemplary embodiments according to the present disclosure are described. The present invention, however, is not limited to these exemplary embodiments.

A metal-clad laminate according to one exemplary embodiment of the present disclosure includes an insulating layer and a metal layer that exists in contact with at least one surface of this insulating layer. This metal-clad laminate 11 includes, as illustrated in FIG. 1, insulating layer 12 and metal layer 13 disposed in contact with both surfaces of the insulating layer. Alternatively, metal-clad laminate 11 may include metal layer 13 only on and in contact with one surface of insulating layer 12. FIG. 1 is a cross-sectional view illustrating a configuration of metal-clad laminate 11 according to the present exemplary embodiment.

Insulating layer 12 includes a cured product of a thermosetting resin composition that contains an epoxy compound having a number-average molecular weight of 1000 or less and at least two epoxy groups per molecule, a polyphenylene ether, a cyanate ester compound, a curing catalyst, and a halogen-based flame retardant. The halogen-based flame retardant is a flame retardant incompatible and dispersed in the thermosetting resin composition. The cured product included in insulating layer 12 is not particularly limited as long as the cured product is obtained by curing the thermosetting resin composition. Insulating layer 12 may include not only the cured product of the thermosetting resin composition but also a fibrous substrate. The fibrous substrate is preferably included in terms of increasing, for example, strength and heat resistance. Specifically, the insulating layer including the fibrous substrate is, for example, a layer obtained by impregnating the fibrous substrate with the thermosetting resin composition and curing the thermosetting resin composition with which the fibrous substrate has been impregnated.

Insulating layer 12 includes a cured product of a thermosetting resin composition. The thermosetting resin composition contains a polyphenylene ether that not only has a low dielectric constant and a low dielectric dissipation factor but also is excellent in heat resistance, and further contains a halogen-based flame retardant. Due to these components, insulating layer 12 retains excellent dielectric characteristics and heat resistance while exhibiting the flame retardancy by the halogen-based flame retardant.

Metal layer 13 includes metal substrate 14 and barrier layer 15 provided on at least contact surface 16 side of metal substrate 14 with insulating layer 12. Metal layer 13 includes, as illustrated in FIG. 1, metal substrate 14 and barrier layer 15 provided on contact surface 16 side of metal substrate 14 with insulating layer 12. Alternatively, metal layer 13 may include a barrier layer on both surfaces of metal substrate 14. Contact surface 16 has, as surface roughness, a ten-point average roughness Rz of 2 μm or less.

Metal layer 13 is in contact with insulating layer 12. That is, insulating layer 12 is in contact with barrier layer 15 of metal layer 13. When a wiring board is produced from metal-clad laminate 11, this metal layer 13 is to be wiring of the wiring board. This metal layer 13 that can be wiring has a low surface roughness on contact surface 16 with insulating layer 12 as described above, so that the wiring also has a low surface roughness on the contact surface with the insulating layer. Due to the reason described above, the wiring board obtained from this metal-clad laminate 11 is considered to be high in flatness and smoothness of an interface between insulating layer 12 and the wiring. This is considered to allow the wiring board to decrease a conductor loss generated by contact of the wiring with insulating layer 12. Accordingly, this metal-clad laminate 11 is considered to give a wiring board having a reduced loss during signal transmission.

Further, metal layer 13 includes, as described above, cobalt-containing barrier layer 15 on contact surface 16 side. This feature is also considered to be capable of reducing the loss during signal transmission. Further, this cobalt-containing barrier layer 15 is considered to be excellent in adhesiveness with insulating layer 12. This is considered to make it possible to sufficiently secure the adhesiveness between metal layer 13 and insulating layer 12 even when the flatness and smoothness of contact surface 16 of metal layer 13 with insulating layer 12 are increased. Accordingly, in the wiring board produced using this metal-clad laminate 11, it is possible to prevent the wiring from peeling from insulating layer 12. This feature also makes it possible for this metal-clad laminate 11 to produce a suitable wiring board.

Due to the reasons described above, metal-clad laminate 11 obtained is capable of suitably producing a wiring board having a reduced loss during signal transmission. Further, this metal-clad laminate 11 is not only capable of suitably producing a wiring board having a reduced loss during signal transmission but also sufficiently exhibits excellent heat resistance, and the flame retardancy by the halogen-based flame retardant.

Contact surface 16 of metal layer 13 has a surface roughness of 2 μm or less as described above, preferably 1.5 μm or less, more preferably 1 μm or less. Contact surface 16 having a lower surface roughness, that is, metal layer 13 having higher flatness and smoothness is, as described above, preferable in terms of being capable of reducing the loss during signal transmission. On the other hand, even when the surface roughness of contact surface 16 is decreased, a limit of the decrease is a ten-point average roughness Rz of around 0.5 μm. When contact surface 16 has an excessively low surface roughness, the adhesiveness between metal layer 13 even having the cobalt-containing barrier layer and insulating layer 12 is likely to decrease. Due to the reasons described above, contact surface 16 preferably has, as surface roughness, a ten-point average roughness Rz of 0.5 μm or more. Accordingly, contact surface 16 has, as surface roughness, a ten-point average roughness Rz ranging preferably from 0.5 μm to 2 μm, more preferably from 0.6 μm to 1.5 μm, further preferably from 0.6 μm to 1 μm. Metal layer 13 includes metal substrate 14 and cobalt-containing barrier layer 15 on contact surface 16 side of metal substrate 14, so that the surface roughness of contact surface 16 is surface roughness of barrier layer 15. Surface roughness of metal substrate 14 is not particularly limited. When the surface roughness of metal layer 13 is not remarkably changed even with barrier layer 15 formed, the surface roughness of metal substrate 14 is preferably equivalent to the surface roughness of contact surface 16 (barrier layer 15).

Metal substrate 14 is not particularly limited as long as the metal substrate can be used for metal layer 13 of metal-clad laminate 11. Specifically, examples of metal substrate 14 include metal foils such as a copper foil, a nickel foil, and an aluminum foil. Especially, a copper foil is preferably used as metal substrate 14.

Barrier layer 15 is not particularly limited as long as the barrier layer is a cobalt-containing layer. Barrier layer 15 necessarily contains cobalt. Although the barrier layer may contain a metal other than cobalt (another metal) without impairing effects of the present disclosure, the barrier layer is preferably a layer made of cobalt. Examples of the other metal include nickel, tin, zinc, and chromium. The barrier layer, however, preferably contains neither nickel nor tin that has high electrical resistance. Alternatively, barrier layer 15 is, for example, a layer formed by plating metal substrate (metal foil) 14. Examples of this plating include sputtering, electrolytic plating, and non-electrolytic plating using cobalt or a cobalt-containing alloy. In the meantime, metal substrate (metal foil) 14 such as a copper foil may be separately subjected to rust-proofing such as chromating in order to prevent surface oxidation, before formation of the above-described cobalt-containing barrier layer.

Thickness of metal layer 13 is different according to, for example, performance required of the wiring board finally obtained and is not particularly limited. The thickness of metal layer 13 preferably ranges from 12 μm to 70 μm, for example.

As metal layer 13, those commercially available can be used. Examples of commercially available metal layer 13 include a cobalt-plated copper foil manufactured by Fukuda Metal Foil & Powder Co., Ltd. More specifically, examples include T9FZ-SV [Rz: 1.6 μm, thickness: 18 μm] and T9DA-SV [Rz: 1.0 μm, thickness: 18 μm] both manufactured by Fukuda Metal Foil & Powder Co., Ltd.

The cured product included in insulating layer 12 is obtained by curing the thermosetting resin composition as described above. The thermosetting resin composition contains an epoxy compound, a polyphenylene ether, a cyanate ester compound, a curing catalyst, and a halogen-based flame retardant. Hereinafter, components contained in this thermosetting resin composition are described.

The epoxy compound is not particularly limited as long as the epoxy compound has a number-average molecular weight (Mn) of 1000 or less and at least two epoxy groups per molecule. The epoxy compound has a number-average molecular weight of 1000 or less as described above, preferably 300 or more, more preferably 400 to 800. The epoxy compound has on average (an average number of epoxy groups of) 2 or more epoxy groups per molecule as described above, preferably 5 or less, more preferably 2 to 3. The thermosetting resin composition containing such an epoxy compound suitably gives insulating layer 12 excellent in flame retardancy and heat resistance with the insulating layer retaining excellent dielectric characteristics of the polyphenylene ether.

Here, the number-average molecular weight can be measured with use of specifically gel permeation chromatography, for example.

The epoxy compound is preferably an epoxy compound containing no halogen atom in a molecule (non-halogen-based epoxy compound). The thermosetting resin composition that contains an epoxy compound having a halogen atom in a molecule (halogen-based epoxy compound), such as a brominated epoxy compound, can increase the flame retardancy of the cured product of the thermosetting resin composition. Therefore, the halogen-based epoxy compound is considered to be added to the thermosetting resin composition in order to increase the flame retardancy. The addition, however, has sometimes decreased the heat resistance of the cured product while increasing the flame retardancy of the cured product. In metal-clad laminate 11 according to the present exemplary embodiment, insulating layer 12 provided includes the cured product of the thermosetting resin composition containing the halogen-based flame retardant, so that the insulating layer is considered to be capable of exhibiting the flame retardancy while suppressing a decrease in heat resistance. Due to the reasons described above, metal-clad laminate 11 is considered to be formed that includes insulating layer 12 excellent in heat resistance and flame retardancy.

Specific examples of the epoxy compound include a dicyclopentadiene epoxy compound, a bisphenol F epoxy compound, a bisphenol A epoxy compound, a phenol-novolac epoxy compound, a naphthalene epoxy compound, and a biphenyl epoxy compound. These may be used alone or in combination of two or more. Among the exemplified compounds, the epoxy compound is preferably dicyclopentadiene epoxy compound, a bisphenol F epoxy compound, a bisphenol A epoxy compound, or a biphenyl epoxy compound, more preferably a dicyclopentadiene epoxy compound. Such an epoxy compound gives metal-clad laminate 11 that includes suitable insulating layer 12 more excellent in, for example, heat resistance with the insulating layer retaining excellent dielectric characteristics of the polyphenylene ether. This is considered to be brought about by high compatibility of the epoxy compound with the polyphenylene ether.

The polyphenylene ether is not particularly limited. The polyphenylene ether has a weight-average molecular weight (Mw) of preferably 5000 or less, more preferably 2000 to 5000, more preferably 2000 to 4000. The polyphenylene ether having an excessively small molecular weight is likely to give a cured product insufficient in heat resistance. On the other hand, the polyphenylene ether having an excessively large molecular weight increases melt viscosity without obtaining sufficient flowability and is likely to be unable to prevent a molding defect. Further, the polyphenylene ether having an excessively large molecular weight decreases reactivity with an epoxy group of the epoxy compound to require a long time for a curing reaction, or not to be incorporated in a cured system, increasing an unreacted part and thus decreasing glass transition temperature of a cured product, so that the heat resistance of the cured product is likely to be decreased. Accordingly, the polyphenylene ether having a weight-average molecular weight within the above range gives metal-clad laminate 11 that includes suitable insulating layer 12 more excellent in, for example, heat resistance and moldability of a cured product while the insulating layer retaining excellent dielectric characteristics of the polyphenylene ether.

Here, the weight-average molecular weight can be measured with use of specifically gel permeation chromatography, for example.

The polyphenylene ether may be obtained by a polymerization reaction or may be obtained by subjecting a high-molecular-weight polyphenylene ether having a weight-average molecular weight ranging from about 10000 to 30000 to a redistribution reaction. Examples of the polyphenylene ether obtained by the redistribution reaction include a polyphenylene ether obtained by heating a high-molecular-weight polyphenylene ether in a solvent such as toluene in presence of a phenol compound and a radical initiator to cause the redistribution reaction. Such a polyphenylene ether obtained by the redistribution reaction has on both terminals of a molecular chain a hydroxy group that contributes to curing and is derived from the phenol-based compound, so that this polyphenylene ether is preferable in terms of retaining further high heat resistance. On the other hand, the polyphenylene ether obtained by the polymerization reaction is preferable in terms of exhibiting excellent flowability.

Adjustment of the molecular weight of the polyphenylene ether can be performed by adjusting polymerization conditions and the like, for a case of, for example, the polyphenylene ether obtained by the polymerization reaction. On the other hand, for a case of the polyphenylene ether obtained by the redistribution reaction, for example, conditions and the like for the redistribution reaction can be adjusted to adjust the molecular weight of the polyphenylene ether obtained. More specifically, it is considered, for example, to adjust a blending amount of the phenol-based compound used in the redistribution reaction. That is, the larger the blending amount of the phenol-based compound is, the smaller the molecular weight of the polyphenylene ether obtained is.

Specific examples of the polyphenylene ether include poly(2,6-dimethyl-1,4-phenylene ether). That is, in the case of the polyphenylene ether obtained by the redistribution reaction, examples include a polyphenylene ether obtained using poly(2,6-dimethyl-1,4-phenylene ether) as the high-molecular-weight polyphenylene ether. The phenol-based compound used in the redistribution reaction is not particularly limited, but preferably used are, for example, polyfunctional phenol-based compounds having two or more phenolic hydroxy groups in a molecule, such as bisphenol A, phenol novolac, and cresol novolac. These may be used alone or in combination of two or more.

The cyanate ester compound is not particularly limited. The cyanate ester compound is a component that acts as a curing agent for the epoxy compound and the polyphenylene ether to form a rigid skeleton. Therefore, the cyanate ester compound can impart high glass transition temperature to the cured product of the thermosetting resin composition. Since having low viscosity, the cyanate ester compound also allows the thermosetting resin composition obtained to retain high flowability. The cyanate ester compound undergoes self-polymerization between molecules of the cyanate ester compound in presence of a curing catalyst. This self-polymerization reaction progresses by forming a triazine ring through a reaction between cyanate groups to cause a polymerization reaction. Such a self-polymerization reaction contributes to improvement of heat resistance.

As the cyanate ester compound, it is preferable to use, for example, a compound having on average (an average number of cyanate groups of) two or more cyanate groups per molecule. Such a cyanate ester compound having many cyanate groups is preferable in terms of increasing the heat resistance of the cured product of the thermosetting resin composition obtained. Here, the average number of cyanate groups of the cyanate ester compound is known from specification of a product of a cyanate resin to be used. Specifically, the number of cyanate groups in the cyanate ester compound is, for example, an average value of cyanate groups per molecule among all molecules of a cyanate resin present in 1 mol of the cyanate resin.

The cyanate ester compound is not particularly limited as long as the cyanate ester compound is a cyanate ester compound used as a raw material for various substrates that can be used for production of laminates and circuit boards. Specific examples of the cyanate ester compound include 2,2-bis(4-cyanatophenyl)propane(bisphenol A cyanate compound), a novolac cyanate ester compound, a bisphenol M cyanate ester compound, bis(3,5-dimethyl-4-cyanatophenyl)methane, and 2,2-bis(4-cyanatophenyl)ethane. Examples of the cyanate ester compound also include derivatives of each cyanate ester compound. Examples of the cyanate ester compound also include cyanate ester resins that are polymers of each cyanate ester. These may be used alone or in combination of two or more.

A content of the epoxy compound is not particularly limited but ranges preferably from 20% by mass to 60% by mass, more preferably from 30% by mass to 50% by mass, relative to a total mass of the epoxy compound, the polyphenylene ether, and the cyanate ester compound. The content of the epoxy compound within the above range is preferable in terms of giving a cured product excellent in, for example, heat resistance while the cured product retaining excellent dielectric characteristics.

A content of the polyphenylene ether is not particularly limited but ranges preferably from 20% by mass to 60% by mass, more preferably from 20% by mass to 40% by mass, relative to the total mass. The content of the polyphenylene ether within the above range is preferable in terms of giving a cured product not only excellent in, for example, heat resistance, but also sufficiently exhibiting excellent dielectric characteristics of the polyphenylene ether.

A content of the cyanate ester compound is not particularly limited but ranges preferably from 20% by mass to 60% by mass, more preferably from 20% by mass to 40% by mass, relative to the total mass. The content of the cyanate ester compound within the above range allows suitable production of insulating layer 12 including a cured product excellent in heat resistance. Specifically, even in a case of insulating layer 12 including the fibrous substrate, it is possible to increase impregnation properties of the thermosetting resin composition with which the fibrous substrate is to be impregnated.

The curing catalyst is not particularly limited as long as the curing catalyst is a catalyst capable of promoting a reaction among the epoxy compound, the polyphenylene ether, and the cyanate ester compound as a curing agent. Specific examples of the curing catalyst include organic metal salts of, for example, zinc, copper, and iron with organic acids such as octanoic acid, stearic acid, acetylacetonate, naphthenic acid, and salicylic acid; tertiary amines such as triethylamine and triethanolamine; and imidazoles such as 2-ethyl-4-imidazole and 4-methylimidazole. These may be used alone or in combination of two or more.

A content of the curing catalyst is not particularly limited. For example, when an organic metal salt is used as the curing catalyst, the content of the curing catalyst preferably ranges from 0.005 parts by mass to 5 parts by mass, relative to a total 100 parts by mass of the epoxy compound, the polyphenylene ether, and the cyanate ester compound. On the other hand, when an imidazole is used as the curing catalyst, the content of the curing catalyst preferably ranges from 0.01 parts by mass to 5 parts by mass, relative to the total 100 parts by mass of the epoxy compound, the polyphenylene ether, and the cyanate ester compound.

The halogen-based flame retardant is not particularly limited as long as the halogen-based flame retardant is a flame retardant incompatible and dispersed in the thermosetting resin composition. Examples of the halogen-based flame retardant include a flame retardant that is not dissolved but is dispersed in the thermosetting resin composition and a flame retardant that is not dissolved but is dispersed in a resin varnish obtained by adding, for example, a solvent to the thermosetting resin composition. The phrase "incompatible and dispersed" refers in this case to a state in which an object (the halogen-based flame retardant) is dispersed in the thermosetting resin composition while forming an island. For example, the phrase refers to a state or the like in which an object (the halogen-based flame retardant) is finely dispersed at a molecular level in the thermosetting resin composition.

Use of a brominated epoxy compound in combination with a cyanate compound decreases the heat resistance, whereas use of no brominated epoxy compound has been found to significantly improve the heat resistance. Further, some findings have been gained that in a case of using a halogenated epoxy compound such as a brominated epoxy compound or using a general halogen-based flame retardant for a purpose of making the thermosetting resin composition flame-retardant, halogen is eliminated at high temperature to generate a halogen ion (or halogen radical) and the eliminated halogen is considered to dissolve a cured product. Therefore, use of the halogen-based flame retardant described above can impart the flame retardancy without decreasing the heat resistance. That is, in a case of using such a flame retardant, the flame retardant in a particle state exists in a matrix to be less likely to decrease the glass transition temperature of a cured product and to be less likely to cause elimination of halogen, so that it is possible to suppress a decrease in heat resistance of the cured product obtained. For the reasons described above, the halogen-based flame retardant is capable of increasing the flame retardancy of the cured product while suppressing a decrease in heat resistance of the cured product.

The halogen-based flame retardant has a melting point of preferably 300° C. or higher, more preferably 320° C. or higher. Such a halogen-based flame retardant is capable of further suppressing a decrease in heat resistance of the cured product. Accordingly, the heat resistance of the insulating layer is further increased to give a metal-clad laminate more excellent in heat resistance.

Specific examples of the halogen-based flame retardant include ethylene dipentabromobenzene, ethylene bistetrabromoimide, decabromodiphenyloxide, tetradecabromodiphenoxybenzene, and bis(tribromophenoxy)ethane. Especially preferable are ethylene dipentabromobenzene, ethylene bistetrabromoimide, decabromodiphenyloxide, and tetradecabromodiphenoxybenzene that have a melting point of 300° C. or higher.

The halogen-based flame retardant dispersed in insulating layer 12 has an average particle size ranging preferably from 0.1 µm to 50 µm, more preferably from 1 µm to 10 µm. The halogen-based flame retardant having such a particle size is dispersed to not only allow insulating layer 12 to retain the heat resistance, but also allow insulation between layers, also allowing the insulating layer to sufficiently exhibit the flame retardancy. The average particle size can be measured using, for example, a particle size distribution analyzer (SALD-2100 manufactured by SHIMADZU CORPORATION).

As regards a content of the halogen-based flame retardant, the halogen-based flame retardant is preferably contained in such a ratio as to give a halogen concentration of 5% by mass to 30% by mass, relative to a mass of the thermosetting resin composition excluding an inorganic component.

The thermosetting resin composition used in the present exemplary embodiment may contain a filler. The filler is, for example, one added to increase the heat resistance and the flame retardancy of the thermosetting resin composition and to increase dimensional stability during heating, and the filler is not particularly limited. That is, addition of the filler is capable of increasing the heat resistance and the flame retardancy and increasing the dimensional stability during heating. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. Especially, the filler is preferably silica, mica, or talc, more preferably spherical silica. These fillers may be used alone or in combination of two or more fillers. The filler may be either used as it is or as one surface-treated with, for example, an epoxysilane-type or aminosilane-type silane coupling agent. This silane coupling agent is preferably a vinylsilane-type, methacryloxysilane-type, acryloxysilane-type, or styrylsilane-type silane coupling agent from a viewpoint of reactivity with a radical polymerizable compound. Such a silane coupling agent increases adhesion strength with the metal foil and interlayer adhesion strength between resins. Not the filler that has been surface-treated in advance but the filler may be used to which the silane coupling agent is added by integral blending.

When the thermosetting resin composition contains the filler, a content of the filler ranges preferably from 10 parts by mass to 100 parts by mass, more preferably from 20 parts by mass to 70 parts by mass, further preferably from 20 parts by mass to 50 parts by mass, relative to the total 100 parts by mass of the epoxy compound, the polyphenylene ether, and the cyanate ester compound.

The thermosetting resin composition used in the present exemplary embodiment may also contain an additive. Examples of the additive include antifoaming agents such as a silicone-based antifoaming agent and an acrylate-based antifoaming agent, an antioxidant, a thermostabilizer, an antistatic agent, an ultraviolet absorber, a dye and a pigment, a lubricant, and dispersants such as a wet dispersant.

The thermosetting resin composition used in the present exemplary embodiment may be used after prepared into a varnish. For example, when a prepreg is produced, the thermosetting resin composition may be used after prepared into a varnish for a purpose of impregnating with the thermosetting resin composition a substrate (fibrous substrate) for forming the prepreg. That is, the thermosetting resin composition may be used as a varnish (resin varnish) into which the thermosetting resin composition has been prepared. In the thermosetting resin composition used in the present exemplary embodiment, the epoxy compound, the polyphenylene ether, and the cyanate ester compound are dissolved in the resin varnish. The halogen-based flame retardant is incompatible and dispersed in the thermosetting resin composition, and is not dissolved but is dispersed in the resin varnish, for example. Such a varnish composition (resin varnish) is prepared as follows, for example.

First, components soluble in an organic solvent are added to an organic solvent for dissolution. For example, when the polyphenylene ether obtained by the redistribution reaction is used as the polyphenylene ether, the epoxy compound, the cyanate ester compound, and the curing catalyst at predetermined amounts are dissolved in a solution of the polyphenylene ether obtained by the redistribution reaction. In this procedure, the solution may be heated as necessary. Subsequently, a component, such as the halogen-based flame retardant and the inorganic filler, that is used as necessary and is insoluble in an organic solvent is added and dispersed using, for example, a ball mill, a bead mill, a planetary mixer, or a roll mill until the solution becomes in a predetermined dispersion state, to prepare a varnish composition. The organic solvent used here is not particularly limited as long as the organic solvent makes the epoxy compound, the polyphenylene ether, and the cyanate ester compound dissolve in the organic solvent and does not inhibit a curing reaction. Specific examples of the organic solvent include toluene and methyl ethyl ketone (MEK).

Insulating layer 12 may also include, as described above, not only the cured product of the thermosetting resin composition but also the fibrous substrate. This fibrous substrate is, for example, the same as a fibrous substrate included in a prepreg described later.

Use of the thermosetting resin composition according to the present exemplary embodiment is capable of giving not only metal-clad laminate 11 but also a prepreg, a metal member with resin (metal foil with resin), and a wiring board as described below. In these cases, the varnish composition described above may be used as the thermosetting resin composition.

A prepreg according to another exemplary embodiment of the present disclosure includes a half-cured product of the thermosetting resin composition and a fibrous substrate. In this prepreg, the fibrous substrate exists in the half-cured product. That is, this prepreg includes the half-cured product and the fibrous substrate that exists in the half-cured product.

The "half-cured product" refers to a product that is obtained by curing the thermosetting resin composition to some extent and can further be cured. That is, the half-cured product is a product obtained by half-curing the thermosetting resin composition (stage B). For example, the thermosetting resin composition that is heated first gradually decreases viscosity and subsequently starts curing to gradually increase viscosity. In this case, the half-curing is, for example, a state between when the viscosity starts to increase and before the thermosetting resin composition is completely cured.

The prepreg according to the present exemplary embodiment includes the half-cured product of the thermosetting resin composition described above. That is, the prepreg includes the half-cured product of the thermosetting resin composition (thermosetting resin composition in the stage B) and the fibrous substrate.

A method for producing the prepreg according to the present exemplary embodiment is not particularly limited as long as the method enables production of the prepreg. For example, examples of the method include a method for impregnating the fibrous substrate with the thermosetting resin composition, for example, the thermosetting resin composition that has been prepared into a varnish. That is, the prepreg according to the present exemplary embodiment is, for example, obtained by impregnating the fibrous substrate with the thermosetting resin composition. An impregnation method is not particularly limited as long as the method enables impregnation of the fibrous substrate with the thermosetting resin composition. Examples of the impregnation method include not only clipping but also methods using a roll, a die coater, or a bar coater, and spraying. As the method for producing the prepreg, the fibrous substrate that has been impregnated with the thermosetting resin composition may be dried or heated after the impregnation. That is, examples of the method for producing the prepreg include a method for impregnating the fibrous substrate with the thermosetting resin composition that has been prepared into a varnish, followed by drying, a method for impregnating the fibrous substrate with the thermosetting resin composition that has been prepared into a varnish, followed by heating, and a method for impregnating the fibrous substrate with the thermosetting resin composition that has been prepared into a varnish, followed by drying and subsequent heating.

Specific examples of the fibrous substrate used to produce the prepreg include glass cloth, aramid cloth, polyester cloth, glass nonwoven fabric, aramid nonwoven fabric, polyester nonwoven fabric, pulp paper, and Linter paper. Use of glass cloth gives a laminate excellent in mechanical strength, and particularly, flattened glass cloth is preferable. Flattening can specifically be performed by, for example, pressing glass cloth continuously with a pressing roll at appropriate pressure to compress yarn in a flat shape. A fibrous substrate can be generally used that has a thickness ranging, for example, from 0.04 mm to 0.3 mm.

The impregnation of the fibrous substrate with the thermosetting resin composition is performed by, for example, immersion or application. This impregnation can be repeated a plurality of times as necessary. In this procedure, it is also possible to repeat the impregnation with use of a plurality of thermosetting resin compositions that are different in composition and concentration, for adjusting the composition and an amount of impregnation to finally desired composition and a finally desired amount of impregnation.

The fibrous substrate that has been impregnated with the thermosetting resin composition is heated under desired heating conditions of, for example, 80° C. to 180° C. and 1 minute to 10 minutes to give a prepreg in the half-cured state (stage B).

Such a prepreg is capable of producing a metal-clad laminate and a wiring board that are excellent in dielectric characteristics, heat resistance, and flame retardancy.

A method for producing metal-clad laminate 11 according to the present exemplary embodiment is not particularly limited as long as the method enables production of metal-clad laminate 11. Examples of the method include a method using a prepreg. Examples of the method for preparing metal-clad laminate 11 using a prepreg include a method for stacking a metal foil such as a copper foil on both or one of upper and lower surfaces of one prepreg or a stacked body obtained by stacking a plurality of prepregs, followed by heat pressure molding for lamination and integration. This method enables preparation of a both surface or one surface metal foil-clad laminate. That is, metal-clad laminate 11 according to the present exemplary embodiment is obtained by stacking a metal foil on the prepreg described above, followed by heat pressure molding. Heat pressure conditions can be appropriately set according to, for example, thickness of a laminate to be produced and a type of the thermosetting resin composition of the prepreg. For example, the conditions can be set to a temperature ranging from 170° C. to 210° C., a pressure ranging from 3.5 MPa to 4 MPa, and a time ranging from 60 minutes to 150 minutes. In the meantime, metal-clad laminate 11 may be produced without using the prepreg. Examples of a method without using the prepreg include a method for applying onto a metal foil the thermosetting resin composition such as a varnish thermosetting resin composition and forming on the metal foil a layer including the thermosetting resin composition, followed by heat pressing.

OTHER EXEMPLARY EMBODIMENTS

Figure 2:
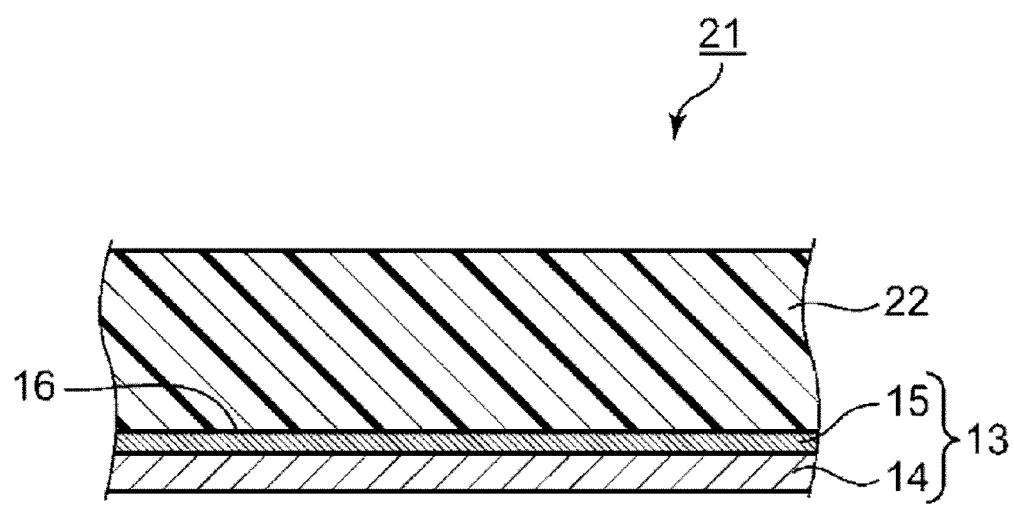
FIG. 2 is a cross-sectional view illustrating a configuration of a metal member with resin according to another exemplary embodiment of the present disclosure.

A metal member with resin (metal foil with resin) according to another exemplary embodiment of the present disclosure includes an insulating layer and a metal layer that exists in contact with one surface of the insulating layer. This metal member with resin (metal foil with resin) 21 includes, as illustrated in FIG. 2, insulating layer 22 and metal layer 13 disposed in contact with one surface of the insulating layer. FIG. 2 is a cross-sectional view illustrating a configuration of metal member with resin 21 according to the present exemplary embodiment.

Insulating layer 22 includes the half-cured product of the thermosetting resin composition described above, and includes the half-cured product of the thermosetting resin composition (thermosetting resin composition in the stage B) and metal layer 13. Insulating layer 22 necessarily includes the half-cured product of the thermosetting resin composition and may include or does not necessarily include a fibrous substrate. As the fibrous substrate, it is possible to use one the same as the fibrous substrate of the prepreg.

Metal layer 13 is the same as metal layer 13 included in metal-clad laminate 11. Specifically, metal layer 13 includes metal substrate 14 and barrier layer 15 provided on at least contact surface 16 side of metal substrate 14 with insulating layer 22. Metal layer 13 includes, as illustrated in FIG. 2, metal substrate 14 and barrier layer 15 provided on contact surface 16 side of metal substrate 14 with insulating layer 22. Alternatively, metal layer 13 may include barrier layer 15 on both surfaces of metal substrate 14. Contact surface 16 has, as surface roughness, a ten-point average roughness Rz of 2 μm or less.

A method for producing metal member with resin 21 according to the present exemplary embodiment is not particularly limited as long as the method enables production of metal member with resin 21. Examples of the method include a method for applying onto metal layer 13 the thermosetting resin composition, for example, the thermosetting resin composition that has been prepared into a varnish. That is, metal member with resin 21 according to the exemplary embodiment of the present disclosure, is for example, obtained by applying the thermosetting resin composition onto metal layer 13. An application method is not particularly limited as long as the method enables application of the thermosetting resin composition onto metal layer 13. Examples of the application method include methods using a roll, a die coater, or a bar coater, and spraying. As the method for producing metal member with resin 21, the metal layer 13 onto which thermosetting resin composition has been applied may be dried or heated after the application. That is, examples of the method for producing metal member with resin 21 include a method for applying onto metal layer 13 the thermosetting resin composition that has been prepared into a varnish, followed by drying, a method for applying onto metal layer 13 the thermosetting resin composition that has been prepared into a varnish, followed by heating, and a method for applying onto metal layer 13 the thermosetting resin composition that has been prepared into a varnish, followed by drying and subsequent heating.

Metal layer 13 onto which the thermosetting resin composition has been applied is heated under desired heating conditions of, for example, 80° C. to 180° C. and 1 minute to 10 minutes to give metal member with resin 21 in the half-cured state (stage B).

Such metal member with resin (metal foil with resin) 21 is capable of producing metal-clad laminate 11 and a wiring board that are excellent in dielectric characteristics, heat resistance, and flame retardancy. That is, metal member with resin 21 is capable of suitably producing a wiring board having a reduced loss during signal transmission.

Figure 3:
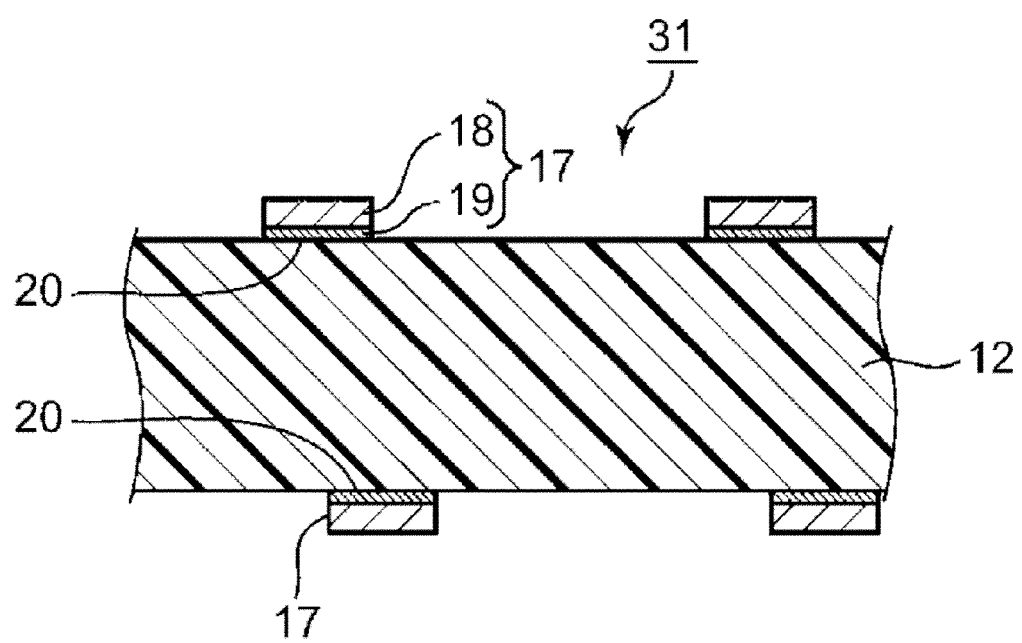
FIG. 3 is a cross-sectional view illustrating a configuration of a wiring board according to another exemplary embodiment of the present disclosure.

A wiring board according to another exemplary embodiment of the present disclosure includes an insulating layer and wiring that exists in contact with at least one surface of the insulating layer. That is, this wiring board includes wiring on a surface of the insulating layer. This wiring board 31 includes, as illustrated in FIG. 3, insulating layer 12 and wiring 17 disposed in contact with both surfaces of the insulating layer. Alternatively, wiring board 31 may include wiring only on and in contact with one surface of insulating layer 12. FIG. 3 is a cross-sectional view illustrating a configuration of wiring board 31 according to the present exemplary embodiment.

Wiring 17 includes, as in metal layer 13 of metal-clad laminate 11, metal substrate 18 and barrier layer 19 provided on at least contact surface 20 side of metal substrate 18 with insulating layer 12. Wiring 17 includes, as illustrated in FIG. 3, metal substrate 18 and barrier layer 19 provided on contact surface 20 side of metal substrate 18 with insulating layer 12. Alternatively, the wiring may include barrier layer 19 on both surfaces of metal substrate 18. Contact surface 20 has, as surface roughness, a ten-point average roughness Rz of 2 μm or less.

Insulating layer 12 is, for example, a layer the same as insulating layer 12 of metal-clad laminate 11.

Examples of wiring 17 include wiring formed by partially removing metal layer 13 of metal-clad laminate 11. Examples of such wiring 17 include wiring formed by a method such as a subtractive method, an additive method, a semi-additive method, chemical mechanical polishing (CMP), trenching, ink-jet printing, squeegee, or transferring.

A method for producing wiring board 31 according to the present exemplary embodiment is not particularly limited as long as the method enables production of wiring board 31. Examples of the method include a method using metal-clad laminate 11. Examples of the method for preparing wiring board 31 using metal-clad laminate 11 include a method for forming a circuit by, for example, etching metal layer 13 on a surface of metal-clad laminate 11. This method is capable of giving wiring board 31 that has a conductor pattern as a circuit provided on the surface of metal-clad laminate 11. That is, wiring board 31 according to the present exemplary embodiment is obtained by partially removing metal layer 13 on the surface of metal-clad laminate 11 to form a circuit.

Wiring board 31 obtained as described above is excellent in dielectric characteristics, heat resistance, and flame retardancy. That is, it is possible to provide wiring board 31 having a reduced loss during signal transmission.

Hereinafter, the present disclosure is described more specifically by way of examples. A scope of the present invention, however, is not limited to these examples.

EXAMPLES

Example 1

[Preparation of Thermosetting Resin Composition]
Components are described that are used to prepare a thermosetting resin composition in the present example.
(Epoxy Compound)
Dicyclopentadiene epoxy compound (HP-7200 manufactured by DIC Corporation, number-average molecular weight Mn: 550, average number of epoxy groups: 2.3)
Bisphenol A epoxy compound (EPICLON 3050 manufactured by DIC Corporation, number-average molecular weight Mn: 1500, average number of epoxy groups: 2)
(Polyphenylene Ether: PPE)
PPE-1: polyphenylene ether obtained by redistribution reaction (weight-average molecular weight Mw: 2500)
Specifically, the polyphenylene ether was obtained as follows. First, 250 g of toluene was charged into 2000-mL flask equipped with a stirring device and a stirring blade. While temperature in this flask was controlled to 90° C., added were 90 g of a high molecular weight PPE (NORYL 640-111 manufactured by SABIC Innovative Plastics, weight-average molecular weight Mw: 25000), 7 g of bisphenol A, and 7 g of benzoyl peroxide, and a mixture was stirred continuously for 2 hours. This procedure gave a solution (solid content concentration: 28% by mass) of the polyphenylene ether (PPE-1) having a weight-average molecular weight Mw of 2500. The weight-average molecular weight is a value in terms of styrene that is obtained by measurement using gel permeation chromatography (GPC).

PPE-2: polyphenylene ether obtained by redistribution reaction (weight-average molecular weight Mw: 4000)
Specifically, the PPE-2 was produced in the same manner as the PPE-1 except for changing the amounts of bisphenol A and benzoyl peroxide to 3.6 g and 3.6 g, respectively. This procedure gave a solution (solid content concentration: 28% by mass) of the polyphenylene ether (PPE-2) having a weight-average molecular weight Mw of 4000.
(Cyanate Ester Compound)
Cyanate ester compound: 2,2-bis(4-cyanatophenyl)propane (BADCy manufactured by Lonza Japan Ltd.)
(Curing Catalyst)
Zinc octanoate (manufactured by DIC Corporation, zinc concentration: 18% by mass)
(Flame Retardant)
SAYTEX 8010: ethylene bis(pentabromophenyl) (SAYTEX 8010 manufactured by ALBEMARLE JAPAN CORPORATION, melting point: 350° C., halogen-based flame retardant incompatible and dispersed in thermosetting resin composition)

SAYTEX CP-2000: tetrabromobisphenol A (SAYTEX CP-2000 manufactured by ALBEMARLE JAPAN CORPORATION, melting point: 181° C., halogen-based flame retardant compatible in thermosetting resin composition)

(Filler)

Inorganic filler (SC-2500-SEJ manufactured by Admatechs Company Limited, silica treated with epoxysilane-type silane coupling agent)

[Preparation Method]

First, the solution of the polyphenylene ether was heated to 90° C., and the epoxy compound and the cyanate ester compound were added to the solution so as to give composition (blending ratio) described in Table 1, and mixed. A mixture was stirred for 30 minutes while kept at 90° C., to completely dissolve the components. Subsequently, the remaining components were added to the solution to give composition (blending ratio) described in Table 1 and dispersed with a ball mill. This procedure gave a varnish thermosetting composition (varnish).

Next, the varnish obtained was impregnated into a fibrous substrate, i.e., glass cloth (#2116 type, WEA116E manufactured by NITTO BOSEKI CO., LTD., E glass, thickness: 0.1 mm) made of E glass and then heated and dried at 150° C. for about 3 minutes to 5 minutes to give a prepreg.

Then, 6 prepregs obtained were stacked, and on both sides of a stacked body, a copper foil that has been plated with cobalt (T9FZ-SV manufactured by Fukuda Metal Foil & Powder Co., Ltd. [copper foil with cobalt barrier layer, Rz: 1.6 thickness: 18 μm], indicated as metal layer 1 in Table 1) was disposed as metal layer 13 in such a manner as to bring the layer formed by cobalt plating (cobalt barrier layer) into contact with the prepreg. Thus, an object to be pressed was prepared, and the object was heated and pressed under conditions with a temperature of 220° C. and a pressure of 3 MPa to give metal-clad laminate 11 to both surfaces of which metal layer 13 adhered and that had a thickness of about 0.75 mm.

Examples 2 to 4 and Comparative Examples 1 to 4

Examples 2 to 4 and Comparative Examples 1 to 4 are each the same as Example 1 except for changing the composition of the thermosetting resin composition, the metal layer, and the fibrous substrate to those indicated in Table 1.

As glass cloth made of NE glass, used was #2116 type manufactured by NITTO BOSEKI CO., LTD. (NEA 116, NE glass, thickness: 0.1 mm).

As metal layer 2, used was a copper foil plated with nickel (copper foil with a nickel layer, T4X-SV manufactured by Fukuda Metal Foil & Powder Co., Ltd. [Rz: 1.1 μm, thickness: 18 μm].

As metal layer 3, used was a copper foil plated with cobalt (copper foil with a cobalt barrier layer, T9DA-SV manufactured by Fukuda Metal Foil & Powder Co., Ltd. [Rz: 1.0 μm, thickness: 18 μm].

As metal layer 4, used was a copper foil plated with cobalt (copper foil with a cobalt barrier layer, T9FZ-HS manufactured by Fukuda Metal Foil & Powder Co., Ltd. [Rz: 6.0 μm, thickness: 18 μm].

Example 5

In Example 5, provided is metal member with resin (metal foil with resin) 21 that includes no fibrous substrate in insulating layer 22. Specifically, metal member with resin 21 was produced in the same manner as in Example 1 except that insulating layer 22 included no fibrous substrate and the composition of the thermosetting resin composition and metal layer 13 were changed to those indicated in Table 1.

Metal-clad laminates 11 or metal member with resin 21 that were prepared as described above were evaluated by methods described below. Methods for evaluating metal member with resin 21 were carried out in the same manner as the methods described below except that metal member with resin 21 was used in place of metal-clad laminate 11.

[Dielectric Characteristics (Relative Dielectric Constant and Dielectric Dissipation Factor)]

A relative dielectric constant and a dielectric dissipation factor of metal-clad laminate 11 were measured at 10 GHz according to IPC-TM650-2.5.5.9. Specifically, the relative dielectric constant and the dielectric dissipation factor of metal-clad laminate 11 were measured at 10 GHz with use of an impedance analyzer (RF impedance analyzer HP429113 manufactured by Agilent Technologies).

[Transmission Loss]

One metal layer 13 of metal-clad laminate 11 was etched to form straight-line wiring having a width of 160 μm and a length of 1000 mm. A 15 GHz signal was applied to this wiring and a transmission loss (dB/m) was measured.

[Glass Transition Temperature (Tg)]

First measured was Tg of an unclad laminate obtained by etching and removing metal layer 13 on both surfaces of metal-clad laminate 11. Specifically, the Tg of the unclad laminate was measured using dynamic mechanical spectrometer "DMS100" manufactured by Seiko Instruments Inc. In the measurement, dynamic mechanical analysis (DMA) was carried out at a frequency of 10 Hz with a bending module, and the Tg (° C.) was defined as a temperature at which tan δ showed a local maximal value when the temperature was raised from room temperature up to 280° C. under a condition with a temperature raising speed of 5° C./minute.

[Oven Heat Resistance]

In compliance with a standard of JIS C 6481, metal-clad laminate 11 was left to stand still in a thermostatic chamber set at 270° C. for 1 hour and then extracted. Then, metal-clad laminate 11 extracted was observed by visual inspection. Metal-clad laminate 11 that was confirmed to have generated no bulge was evaluated as "○" and metal-clad laminate 11 that was confirmed to have generated a bulge was evaluated as "×."

Table 1 shows results of the evaluations.

TABLE 1

| | | | | Example | | | | | Comparative Example | | | |
|---|---|---|---|---|---|---|---|---|---|---|---|---|
| | | | | 1 | 2 | 3 | 4 | 5 | 1 | 2 | 3 | 4 |
| Thermosetting resin composition (part by mass) | Epoxy compound | Dicyclopentadiene | Mn550 | 45 | 45 | 45 | 45 | 45 | 45 | 45 | — | 45 |
| | | Bisphenol A | Mn1500 | — | — | — | — | — | — | — | 45 | — |
| | PPE | PPE-1 | Mw2500 | 30 | — | 30 | 30 | 30 | 30 | 30 | 30 | 30 |
| | | PPE-2 | Mw4000 | — | 30 | — | — | — | — | — | — | — |
| | Cyanate ester compound | | | 25 | 25 | 25 | 25 | 25 | 25 | 25 | 25 | 25 |

TABLE 1-continued

|  |  |  |  | Example | | | | | Comparative Example | | | |
|---|---|---|---|---|---|---|---|---|---|---|---|---|
|  |  |  |  | 1 | 2 | 3 | 4 | 5 | 1 | 2 | 3 | 4 |
|  | Curing catalyst | Zinc octanoate |  | 0.01 | 0.01 | 0.01 | 0.01 | 0.01 | 0.01 | 0.01 | 0.01 | 0.01 |
|  | Flame retardant | SAYTEX8010 |  | 25 | 25 | 25 | 25 | 25 | 25 | 25 | 25 | — |
|  |  | SAYTEX CP-2000 |  | — | — | — | — | — | — | — | — | 25 |
|  | Filler | Inorganic filler |  | 50 | 50 | 50 | 50 | 50 | 50 | 50 | 50 | 50 |
| Fibrous substrate |  | E glass |  | ○ | ○ | — | ○ | — | ○ | ○ | ○ | ○ |
|  |  | NE glass |  | — | — | ○ | — | — | — | — | — | — |
| Metal layer | Metal layer 1 | Cobalt | Rz 1.6 μm | ○ | ○ | ○ | — | ○ | — | — | — | — |
|  | Metal layer 2 | Nickel | Rz 1.1 μm | — | — | — | — | — | ○ | — | ○ | ○ |
|  | Metal layer 3 | Cobalt | Rz 1.0 μm | — | — | — | ○ | — | — | — | — | — |
|  | Metal layer 4 | Cobalt | Rz 6.0 μm | — | — | — | — | — | — | ○ | — | — |
| Evaluation |  | Relative dielectric constant |  | 3.7 | 3.7 | 3.3 | 3.7 | 3.0 | 3.7 | 3.7 | 3.8 | 3.8 |
|  |  | Dielectric dissipation factor |  | 0.009 | 0.009 | 0.007 | 0.009 | 0.006 | 0.009 | 0.009 | 0.011 | 0.012 |
|  |  | Transmission loss (dB/m) |  | −35 | −35 | −31 | −34 | −29 | −37 | −43 | −41 | −43 |
|  |  | Glass transition temperature Tg (° C.) |  | 220 | 220 | 220 | 220 | 220 | 220 | 220 | 200 | 180 |
|  |  | Oven heat resistance |  | ○ | ○ | ○ | ○ | ○ | ○ | ○ | x | x |

As is understood from Table 1, metal-clad laminates 11 according to Examples 1 to 4 and metal member with resin 21 according to Example 5 each had capability to suitably produce wiring board 31 that is excellent in dielectric characteristics and has a reduced loss during signal transmission.

Metal-clad laminates 11 according to Examples 1 to 4 and metal member with resin 21 according to Example 5 were also found to not only have a reduced loss during signal transmission but also be excellent in heat resistance. In metal-clad laminates 11 according to Examples 1 to 4 and metal member with resin 21 according to Example 5, insulating layer 12, 22 was provided that included a cured product of a thermosetting resin composition that contained an epoxy compound having a number-average molecular weight of 1000 or less and at least two epoxy groups per molecule, a polyphenylene ether, a cyanate ester compound, a curing catalyst, and a halogen-based flame retardant incompatible and dispersed in the thermosetting resin composition, and metal layer 13 satisfied following conditions. Metal layer 13 includes a cobalt barrier layer, which has, as surface roughness, a ten-point average roughness Rz of 2 μm or less. The metal-clad laminates according to Examples 1 to 4 and metal member with resin 21 according to Example 5 each have this barrier layer 15 disposed in contact with insulating layer 12, 22.

In contrast, when the metal layer was used that included as the barrier layer the layer made of nickel (Comparative Example 1) and when the metal layer having an Rz of more than 2 μm was used (Comparative Example 2), the loss during signal transmission was larger than the losses in the examples. Further, also when the thermosetting resin composition did not satisfy the configurations described above (Comparative Examples 3 and 4), the loss during signal transmission was larger than the losses in the examples. The heat resistance and the like were also low.

INDUSTRIAL APPLICABILITY

A metal-clad laminate and a metal foil with resin according to the present disclosure are capable of giving a wiring board having a reduced loss during signal transmission and are useful as being capable of increasing speed of signal transmission.

The invention claimed is:

1. A metal-clad laminate comprising: an insulating layer; and a metal layer in contact with at least one surface of the insulating layer,
    the insulating layer including a cured product of a thermosetting resin composition that contains an epoxy compound, a polyphenylene ether, a cyanate ester compound, a curing catalyst, and a halogen-based flame retardant, the epoxy compound having a number-average molecular weight of 1000 or less and at least two epoxy groups per molecule
    the halogen-based flame retardant being a flame retardant incompatible and dispersed in the thermosetting resin composition,
    the metal layer including a metal substrate and a cobalt-containing barrier layer provided on at least a contact surface side of the metal substrate, the contact surface being in contact with the insulating layer, and
    the contact surface having, as surface roughness, a ten-point average roughness Rz of 2 μm or less.

2. The metal-clad laminate according to claim 1, wherein the halogen-based flame retardant has a melting point of 300° C. or higher.

3. The metal-clad laminate according to claim 1, wherein the halogen-based flame retardant is at least one selected from the group consisting of ethylene dip entabrom ob enzene, ethylene bi stetrabromoimi de, decabromodiphenyloxide, tetradecabromodiphenoxybenzene, and bis(tribromophenoxy)ethane.

4. The metal-clad laminate according claim 1, wherein the polyphenylene ether has a weight-average molecular weight of 5000 or less.

5. The metal-clad laminate according to claim 1, wherein the epoxy compound has no halogen atom in a molecule.

6. The metal-clad laminate according to claim 1, wherein the epoxy compound is at least one selected from a dicyclopentadiene epoxy compound, a bisphenol F epoxy compound, a bisphenol A epoxy compound, and a biphenyl epoxy compound.

7. A metal member with resin, the metal member comprising: an insulating layer; and a metal layer in contact with one surface of the insulating layer, the insulating layer including a half-cured product of a thermosetting resin composition that contains an epoxy compound, a polyphenylene ether, a cyanate ester compound, a curing catalyst, and a halogen-based flame retardant, the epoxy compound having a number-average molecular weight of 1000 or less and at least two epoxy groups per molecule, the halogen-based flame retardant being a flame retardant incompatible and dispersed in the thermosetting resin composition, the metal layer including a metal substrate and a cobalt-containing barrier layer provided on at least a contact surface of the metal substrate, the contact surface being in contact with the insulating layer, and the contact surface having, as surface roughness, a ten-point average roughness Rz of 2 μm or less.

8. A wiring board comprising: an insulating layer; and wiring in contact with at least one surface of the insulating layer, the insulating layer including a cured product of a thermosetting resin composition that contains an epoxy compound, a polyphenylene ether, a cyanate ester compound, a curing catalyst, and a halogen-based flame retardant, the epoxy compound having a number-average molecular weight of 1000 or less and at least two epoxy groups per molecule, the halogen-based flame retardant being a flame retardant incompatible and dispersed in the thermosetting resin composition, the wiring including a metal substrate and a cobalt-containing barrier layer provided on at least a contact surface of the metal substrate, the contact surface being in contact with the insulating layer, and the contact surface having, as surface roughness, a ten-point average roughness Rz of 2 μm or less.

* * * * *